(12) United States Patent
Gu et al.

(10) Patent No.: US 9,612,284 B2
(45) Date of Patent: Apr. 4, 2017

(54) SYSTEM AND METHOD FOR HYBRID BOARD-LEVEL DIAGNOSTICS

(71) Applicant: FutureWei Technologies, Inc., Plano, TX (US)

(72) Inventors: Xinli Gu, Sunnyvale, CA (US); Zhaobo Zhang, Santa Clara, CA (US); Yaohui Xie, Cupertino, CA (US)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 861 days.

(21) Appl. No.: 14/011,497

(22) Filed: Aug. 27, 2013

(65) Prior Publication Data

US 2014/0058698 A1 Feb. 27, 2014

Related U.S. Application Data

(60) Provisional application No. 61/693,483, filed on Aug. 27, 2012.

(51) Int. Cl.
  *G06F 19/00* (2011.01)
  *G01R 31/319* (2006.01)
  *G01R 31/317* (2006.01)

(52) U.S. Cl.
  CPC . *G01R 31/31903* (2013.01); *G01R 31/31705* (2013.01)

(58) Field of Classification Search
  CPC .............. G01F 11/2257; G06N 3/0427; G01R 31/31705; G01R 31/31903
  USPC .................................. 702/117, 118, 182–185
  See application file for complete search history.

(56) References Cited

U.S. PATENT DOCUMENTS

2012/0233104 A1* 9/2012 Wang .................. G06F 11/2257
  706/21

OTHER PUBLICATIONS

MacCanelli, M., et al., "Practical Application of Automated Fault Diagnosis at the Chip and Board Levels," Defect and Fault Tolerance in VLSI Systems, 1992 IEEE International Workshop, Nov. 4-6, 1992, pp. 297-304.
Fenton, W. G., et al., "Fault Diagnosis of Electronic Systems Using Intelligent Techniques: A Review," IEEE Transactions on Systems, Man, and Cybernetics-Part C: Applications and Review, vol. 31, No. 3, Aug. 2001, pp. 269-281.
O'Farrill, C., et al., "Optimized Reasoning-Based Diagnosis for Non-Random, Board-Level, Production Defects," IEEE International Test Conference, Nov. 8, 2005, pp. 1-7.
Yuhao, S., et al., "A Synthesized SVM and its Application in Fault Diagnosis for Circuit Board Based on Virtual Instrument," The Ninth International Conference on Electronic Measurement & Instruments, Aug. 16-19, 2009, pp. 4-907-4-911.

* cited by examiner

*Primary Examiner* — Edward Raymond
(74) *Attorney, Agent, or Firm* — Slater Matsil, LLP

(57) ABSTRACT

A method for diagnosing a faulty board includes generating a table of debug knowledge in accordance with predefined debug rules, and configuring a diagnostic engine in accordance with the table of debug knowledge. The method also includes subjecting the faulty board to the diagnostic engine to generate a suggested repair, receiving feedback regarding an effectiveness of the suggested repair, and reconfiguring the diagnostic engine in accordance with the feedback regarding the effectiveness of the suggested repair.

24 Claims, 10 Drawing Sheets

SYSTEM AND METHOD FOR HYBRID BOARD-LEVEL DIAGNOSTICS

This application claims the benefit of U.S. Provisional Application No. 61/693,483, filed on Aug. 27, 2012, entitled "Automatic Board-Level Diagnostic System and Method," which application is hereby incorporated herein by reference.

TECHNICAL FIELD

The present disclosure relates generally to device manufacturing, and more particularly to a system and method for hybrid board-level diagnostics.

BACKGROUND

Diagnosis of functional failures at the circuit board level improves product yield and reduces manufacturing cost. Generally, state-of-the-art board-level diagnostic software is unable to cope with high design complexity and ever-increasing clock frequencies. Some prior art diagnostic systems use brute-force trial-and-error manual debugging. Other diagnostic systems use model-based and rule-based diagnosis limited by knowledge acquisition. Yet other systems using artificial neural network-based inference suffer from theoretical weakness, and limited diagnostic accuracy.

The identification of the root cause of a failure is a major issue. Ambiguous or incorrect repair suggestions lead to long debug times and even to wrong repair actions, which significantly increases the repair cost and adversely impacts yield. To make the matter worse, a board typically has to be scrapped after a repair fails a couple of times. Thus, there is a need for an effective and efficient diagnostic system targeting the above issues.

SUMMARY OF THE DISCLOSURE

Example embodiments of the present disclosure which provide a system and method for hybrid board-level diagnostics.

In accordance with an example embodiment of the present disclosure, a method for diagnosing a faulty board is provided. The method includes generating, by a controller, a table of debug knowledge in accordance with predefined debug rules, and configuring, by the controller, a diagnostic engine in accordance with the table of debug knowledge. The method also includes subjecting, by the controller, the faulty board to the diagnostic engine to generate a suggested repair, and receiving, by the controller, feedback regarding an effectiveness of the suggested repair. The method further includes reconfiguring, by the controller, the diagnostic engine in accordance with the feedback regarding the effectiveness of the suggested repair.

In accordance with another example embodiment of the present disclosure, a controller is provided. The controller includes a processor. The processor generates a table of debug knowledge in accordance with predefined debug rules, sets up a diagnostic engine in accordance with the table of debug knowledge, subjects the faulty board to the diagnostic engine to generate a suggested repair, processes feedback regarding an effectiveness of the suggested repair, and adjusts the diagnostic engine in accordance with the feedback regarding the effectiveness of the suggested repair.

In accordance with another example embodiment of the present disclosure, a board diagnostic system is provided. The board diagnostic system includes a hybrid diagnostic engine, and a processor operatively coupled to the hybrid diagnostic engine. The hybrid diagnostic engine diagnoses a faulty board in accordance with a fault symptom. The processor generates a table of debug knowledge in accordance with predefined debug rules, sets up the hybrid diagnostic engine in accordance with the table of debug knowledge, subjects the faulty board to the diagnostic engine to generate a suggested repair, processes feedback regarding an effectiveness of the suggested repair, and adjusts the hybrid diagnostic engine in accordance with the feedback regarding the effectiveness of the suggested repair.

One advantage of an embodiment is that a hybrid diagnostic system makes use of predefined debug rules to accelerate learning process in a learning-based diagnostic engine. The hybrid diagnostic system makes use of rule-based diagnosis techniques to facilitate fast and accurate repair in the initial diagnostic phase, and a learning-based diagnosis technique to enable diagnostic adjustments based on newly acquired repair data.

A further advantage of an embodiment is that the use of the hybrid diagnostic system enables the use of historical data to provide sufficient learning data, especially when historical data from multiple manufacturing facilities are used, while providing the ability to make diagnostic adjustments as needed.

BRIEF DESCRIPTION OF THE DRAWINGS

For a more complete understanding of the present disclosure, and the advantages thereof, reference is now made to the following descriptions taken in conjunction with the accompanying drawing, in which.

DETAILED DESCRIPTION OF ILLUSTRATIVE EMBODIMENTS

The operating of the current example embodiments and the structure thereof are discussed in detail below. It should be appreciated, however, that the present disclosure provides many applicable inventive concepts that can be embodied in a wide variety of specific contexts. The specific embodiments discussed are merely illustrative of specific structures of the disclosure and ways to operate the disclosure, and do not limit the scope of the disclosure.

One embodiment of the disclosure relates to hybrid board-level diagnostics. For example, a controller of a hybrid diagnostic engine generates a table of debug knowledge in accordance with predefined debug rules, and configures a diagnostic engine in accordance with the table of debug knowledge. The controller also subjects the faulty board to the diagnostic engine to generate a suggested repair, and receives feedback regarding an effectiveness of the suggested repair. The controller further reconfigures the diagnostic engine in accordance with the feedback regarding the effectiveness of the suggested repair.

The present disclosure will be described with respect to example embodiments in a specific context, namely a manufacturing environment where faulty boards are functionally diagnosed. The disclosure may be applied to the diagnosis of digital, analog, and a combination of digital and analog boards.

Figure 1:
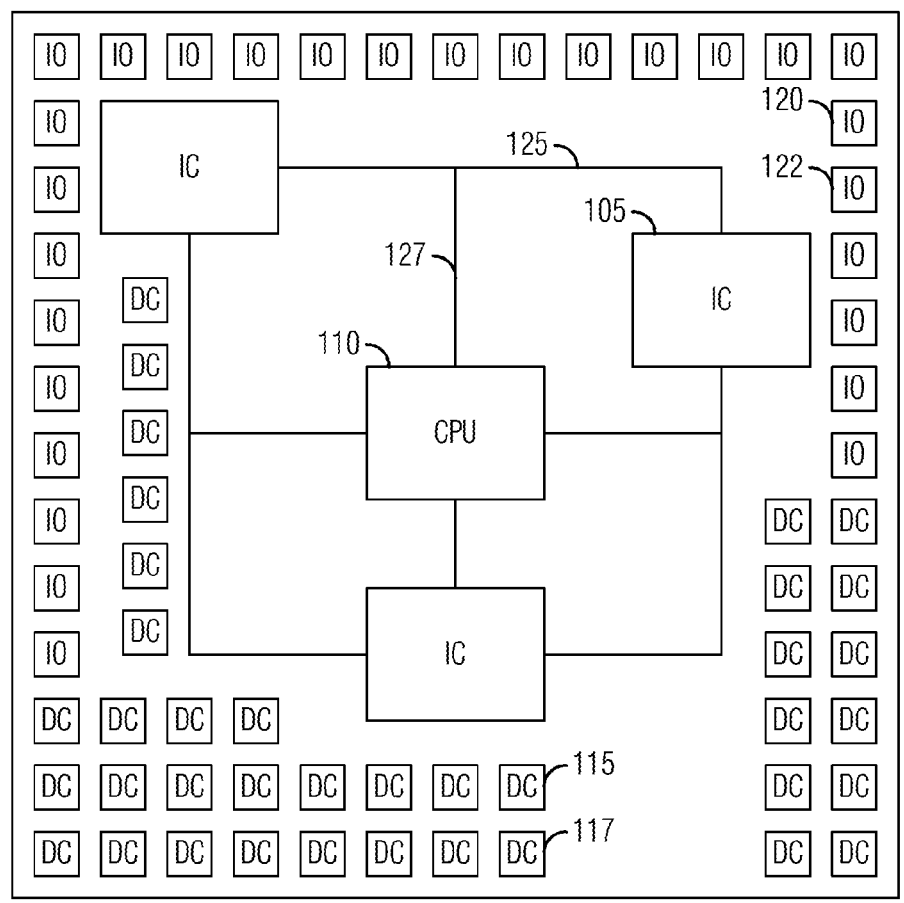
FIG. 1 illustrates an example board according to example embodiments described herein.

FIG. 1 illustrates a board 100. Board 100 may be representative of modern boards being manufactured in a modern manufacturing facility. Board 100 may include a plurality of integrated circuits (IC), such as IC 105. In addition to ICs, which may be memories, custom designed to perform specific tasks, board 100 may also include a central processing unit(s) (CPU) 110. CPU 110 may provide processing power to execute programs and/or applications, such as an operating system, firmware, algorithms, and the like. In addition to ICs and/or CPU(s), board 100 may also include discreet components (DC), such as DC 115 and DC 117, which may be components such as resistors, capacitors, inductors, connectors, and the like, as well as more complex entities, such as cameras, sensors, and the like. Furthermore, board 100 may also include input/output (IO), such as IO 120 and IO 122, which allow for signals to enter and/or exit board 100. The various parts of board 100 may be coupled through connectors (e.g., wires and/or buses), such as connector 125 and connector 127.

Although board 100 is shown as having a single circuit board, as designs continue to become more complex, it is common to have a board made up of many sub-boards. In general, a board may include multiple sub-boards with each sub-board including any number of chips and/or memories with each chip and/or memory having hundreds of IOs and millions (if not more) logic gates.

Typically, any part of board 100 may fail. The failed part may cause board 100 to not work at all or to exhibit an unusual or unintended behavior(s) that differs from an intended behavior. The unusual behavior may be referred to as a symptom and several unusual behaviors may be referred to as a syndrome. In general, the individual components of board 100 may have been tested prior to assembly. Fault screening and isolation may be difficult in such situations. It is not unusual for all of the individual components to pass testing, board 100 may still not operate properly. Differences exist between board-level testing and chip-level testing, since with chip-level testing the parts are tested in a stand-alone mode. However, with board-level testing, the parts are tested together and other issues, such as signal integrity, need to be considered.

Functional testing may target defects that typically cannot easily detected by structural testing. Functional test sequences are often derived from design verification programs and may be close to practical scenarios that occur in normal use. However, since faults are detected at a symptom (or syndrome) level, it may be difficult to determine which part(s) need to be adjusted or replaced. Furthermore, controllability and/or observability of functional tests may be limited and it may be challenging to reproduce functional faults.

A diagnostic system may be a part of an overall test system and may be used to provide a repair suggestion for a faulty board based on a symptom or a syndrome of the faulty board. The repair suggestion may include information about a replacement(s) and/or an adjustment(s) of parts of the faulty board, which if made, should fix the faulty board. In general, the overall test system may be provided with untested boards as manufactured by a manufacturing facility and the overall test system may determine if a board is good or if a board is faulty (or bad). If a board is good, the board may be packaged and shipped to a customer. If a board is faulty, the board may be provided to the diagnostic system for diagnosis and repair if possible. The repaired board may be provided back to the overall test system to determine if the board has actually been repaired (if so, it may be packaged and shipped to the customer) or not (if so, the board may be re-diagnosed or discarded).

According to an example embodiment, a diagnostic system may be a system that when provided with a symptom (or syndrome) of a faulty board, presents a repair(s) and/or adjustment(s) that will fix the fault(s) causing the symptom (or syndrome). The diagnostic system may be quick to learn with a short (or no) learning or training cycle. The diagnostic system may also be able to, on its own, make adjustments to its repair suggestions based on newly acquired results of the repairs it has suggested. In other words, the diagnostic system may be able to self-learn. Such a diagnostic system may be referred to as a hybrid diagnostic system.

Figure 2A:
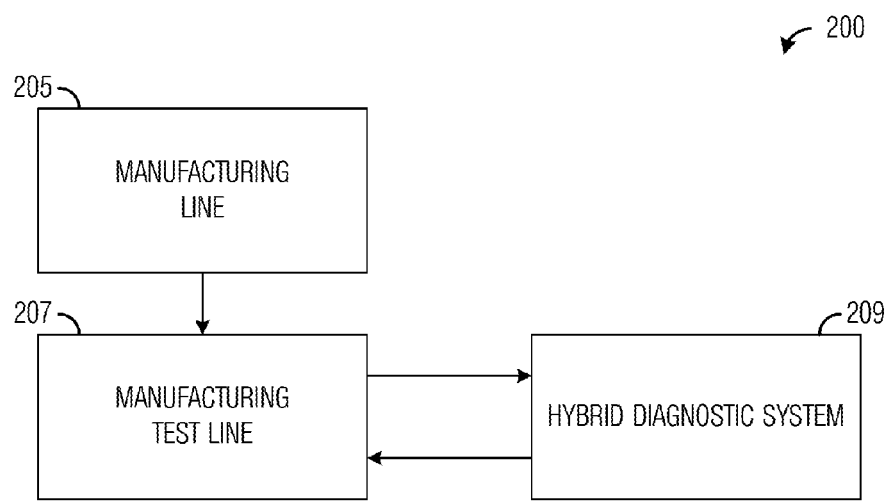
FIG. 2a illustrates an example manufacturing system according to example embodiments described herein.

FIG. 2a illustrates a manufacturing system 200. Manufacturing system 200 may include a manufacturing line 205 where boards are manufactured, a manufacturing test line 207 where the boards are tested, and a hybrid diagnostic system 209 where faulty boards are diagnosed and repair suggestions are made. Manufacturing test line 207 and hybrid diagnostic system 209 may collectively be referred to as a test system.

Figure 2B:
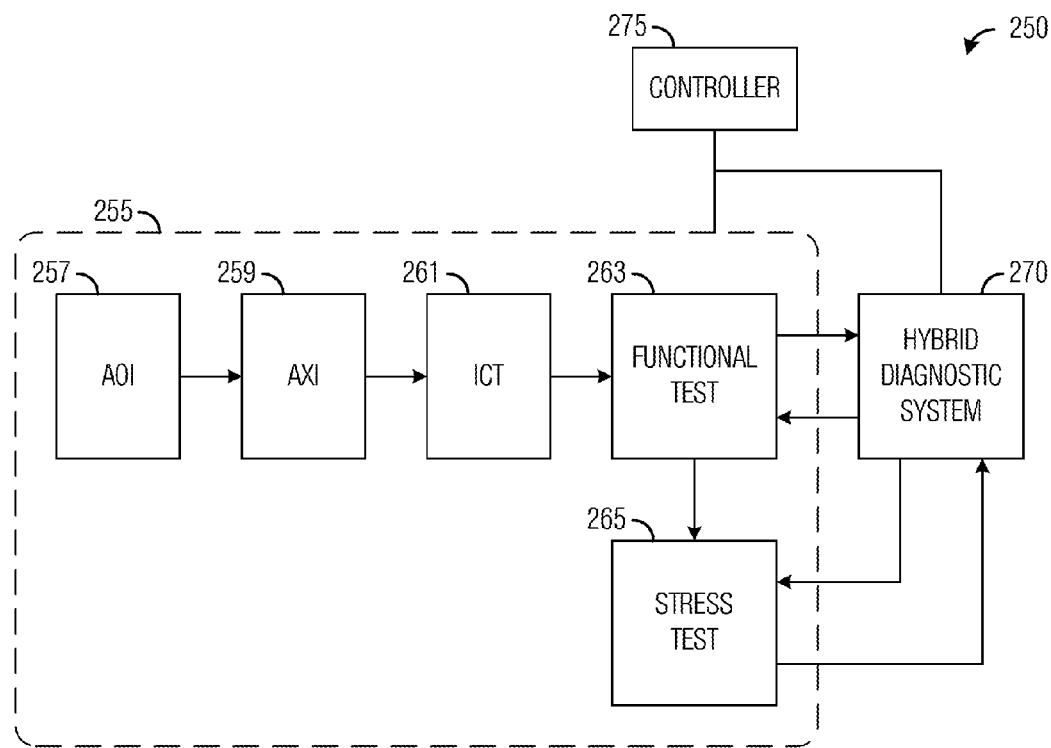
FIG. 2b illustrates an example detailed view of a test system according to example embodiments described herein.

FIG. 2b illustrates a detailed view of a test system 200. Test system 200 includes a manufacturing test line 255 and a hybrid diagnostic system 270. A controller 275 may provide overall control of manufacturing test line 255 and hybrid diagnostic system 270, as well as provide a user interface, communications capability, storage management, and the like. Manufacturing test line 255 may include testing capabilities such as: automatic optical inspection (AOI) 257, automatic x-ray inspection (AXI) 259, in-circuit test (ICT) 261, functional test 263, and stress test 265. It is noted that AOI 257, AXI 259, and ICT 261 are generally component-level tests, while functional test 263 and stress test 265 are normally board-level tests. Functional test 263 and stress test 265 may be coupled to hybrid diagnostic system 270, which may provide repair suggestions for faulty boards.

Although shown in FIG. 2b as being coupled to functional test 263 and stress test 265, hybrid diagnostic system 270 may be coupled to other tests in manufacturing test line 255.

Figure 2C:
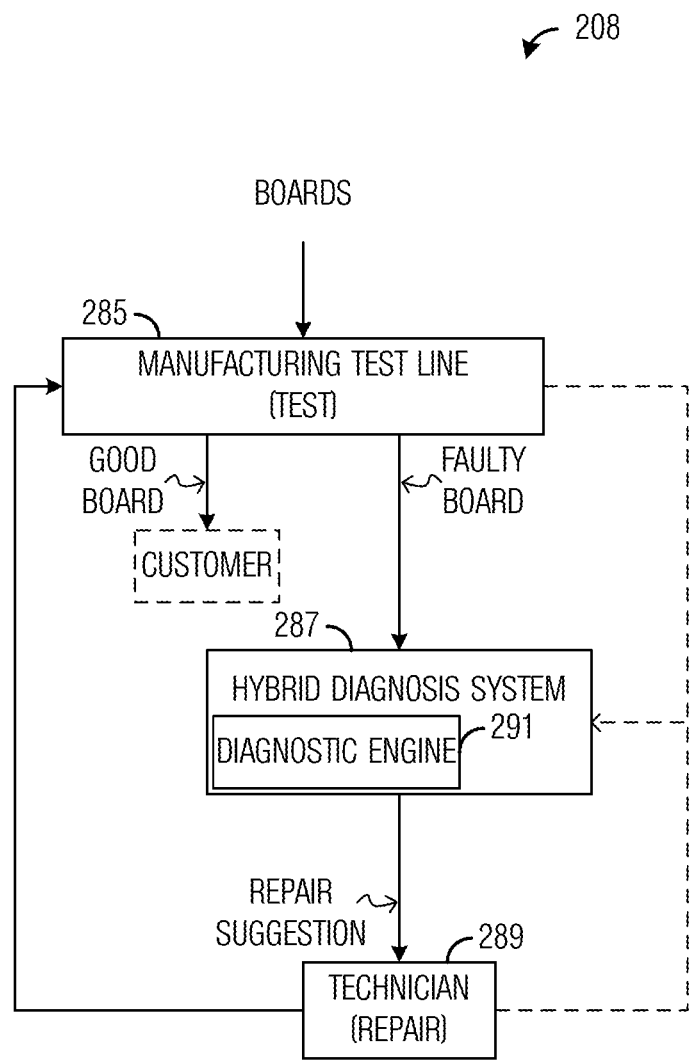
FIG. 2c illustrates an example detailed view of a testing process according to example embodiments described herein.

FIG. 2c illustrates a detailed view of a testing process 280. Testing process 280 includes providing boards that have not been tested to a manufacturing test line 285, where the boards may undergo functional test as well as potentially other forms of test. Once the boards have undergone testing in manufacturing test line 285, each of the boards may be labeled as either good (from where they may be packaged and shipped to customers) or faulty (or bad). Boards that are labeled as being faulty may be provided to a hybrid diagnosis system 287 where they are diagnosed (according to their symptom or syndrome, for example) and repair suggestions are made. The faulty boards and their associated repair suggestions may be provided to a technician(s) 289 where the faulty boards may be repaired per the repair suggestions. The repaired boards may be returned to manufacturing test line 285 where they are retested. Information about the effectiveness of the repairs may be provided to hybrid diagnostic system 287, where the information may be used to update hybrid diagnostic system 287. Manufacturing test line 285 and/or technician 289 may repair the information about the effectiveness of the repairs. As an example, if a repair suggestion for a particular symptom or syndrome does not correct the problem, the information may result in hybrid diagnostic system 287 changing its repair suggestion for subsequent faulty boards with the same symptom or syndrome. As another example, if a repair suggestion for a particular symptom or syndrome does correct the problem, the information may result in hybrid diagnostic system 287 providing the repair suggestion for subsequent faulty boards with the same symptom or syndrome with more certainty.

Hybrid diagnostic system 287 may include a diagnostic engine 291. Diagnostic engine 291 may be a module, an application, or a program executing in a processor in hybrid diagnostic system 287 or a standalone entity in hybrid diagnostic system 287 that receives as input information about a symptom or a syndrome of a faulty board and provides as output a repair suggestion to fix the symptom or syndrome.

According to an example embodiment, diagnostic engine 291 may be implemented using a support vector machine (SVM). In general, a SVM is a supervised machine learning algorithm that allows for simple geometrical interpretation of a margin, features uniqueness of solution, statistical robustness of a loss function, modularity of a kernel function, as well as overfitting control through the choice of single regularization parameter.

A goal of a SVM may be to define an optimal separating hyperplane (OSH) to separate two classes, with vectors from the same class falling on the same side of the OSH and a distance from the closest vector to the OSH being the maximum among all of the separating hyperplanes. It is noted that the solution is only based on those vectors that are closest to the OSH. These vectors are referred to as support vectors. Therefore, the classification accuracy does not depend on the size of the training data set, for example.

Figure 3:
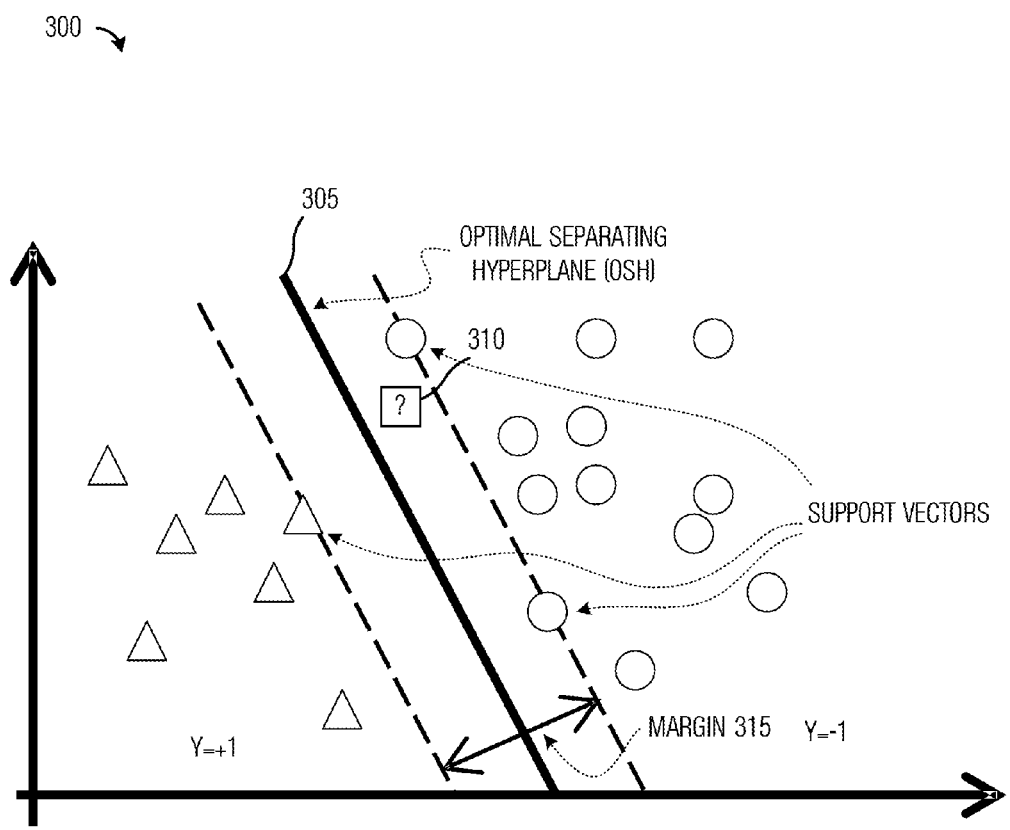
FIG. 3 illustrates an example plot of a set of two-dimensional vectors according to example embodiments described herein.

FIG. 3 illustrates a plot 300 of a set of two-dimensional vectors. Diagram 300 includes vectors (shown as circles and triangles) and an OSH 305. On a left side of OSH 305 are vectors (shown as the triangles) belonging to a class labeled as Y=+1 and on a right side of OSH 305 are vectors (shown as circles) belonging to a class labeled as Y=−1. Once OSH 305 is determined, new vectors may be classified using an SVM associated with diagram 300 in accordance with OSH 305. As an illustrative example, vector 310 may be classified as belonging to class Y=−1 since it lies to the right of OSH 305.

An OSH may be determined as follows: Let $(x_i, y_i)$, $i=1, 2, \ldots, n$ be a set of training data, and $x_i \in R^d$, $y_i \in \{-1, +1\}$. The vector $x_i$ is considered as input vectors and d is the dimension of the input vectors. Each input vector belongs to one of two classes, a first class labeled y=+1 and a second class labeled y=−1. If the set of training data can be linearly separated, there must be a hyperplane satisfying:

$$y_i(w \cdot x_i + b) > 0, i=1, \ldots, N, \quad (1)$$

where w is an d-dimensional vector, b is a scalar, and $w \cdot x_i$ is the inner product of w and $x_i$.

In order to determine the OSH, the distance from the closest vector to the hyperplane needs to be maximized. It can be shown that the distance from the closest vector to the hyperplane is expressible as $$\frac{1}{\|w\|} \text{ and } \frac{2}{\|w\|}$$

is definable as the margin (e.g., shown in FIG. 3 as margin 315). The margin may be a measure of the generalization ability, with larger margins reflecting better the generalization of the classifier. The linear SVM problem may be formulated as $$\text{MINIMIZE}: \tfrac{1}{2}\|w\|^2, \quad (2)$$

subject to $$y_i(w \cdot x_i + b) \geq 1, i=1, \ldots, N. \quad (3)$$

The expression (3), a quadratic optimization problem, may be solved using Lagrange multipliers. Let $\alpha = (\alpha_1, \ldots, \alpha_N)$ be N non-negative Lagrange multipliers associated with each input vector $x_i$. For discussion purposes, let $\alpha^0 = (\alpha_1^0, \ldots, \alpha_N^0)$ be the solution to the Lagrange problem. The solution of the optimization problem may be expressible as $$w^0 = \Sigma_{i=1}^{N} \alpha_i^0 y_i x_i \quad (4)$$

and $$b^0 = 1 - w^0 \cdot x_i. \quad (5)$$

The decision function of the OSH may be expressed as $$f(x) = sgn(\Sigma_{i=1}^{N} \alpha_i^0 y_i x_i \cdot x + b^0). \quad (6)$$

In order to classify a new vector, if f(x)>0 the new vector belong to the class labeled y=+1. If f(x)<0 the new vector belongs to the class labeled y=−1. When the data is not linearly separable, slack variables in linear SVMs or non-linear SVMs may be used. When slack variables are used, the optimization problem may be expressed as $$\text{MINIMIZE}: \tfrac{1}{2}\|w\|^2 + C\Sigma_{i=1}^{N} \xi_i, \quad (7)$$

subject to $$y_i(w \cdot x_i + b) \geq 1 + \xi_i, i=1, \ldots, N, \quad (8)$$

where the slack variable $\xi_i \geq 0$, and C is a penalty parameter. The purpose of the slack variable is to allow misclassifications, which have their corresponding $\xi_i > 1$. The value of C is adjustable, with larger C meaning higher penalty for misclassifications. The choice of C may balance between overfitting and underfitting.

Figure 4:
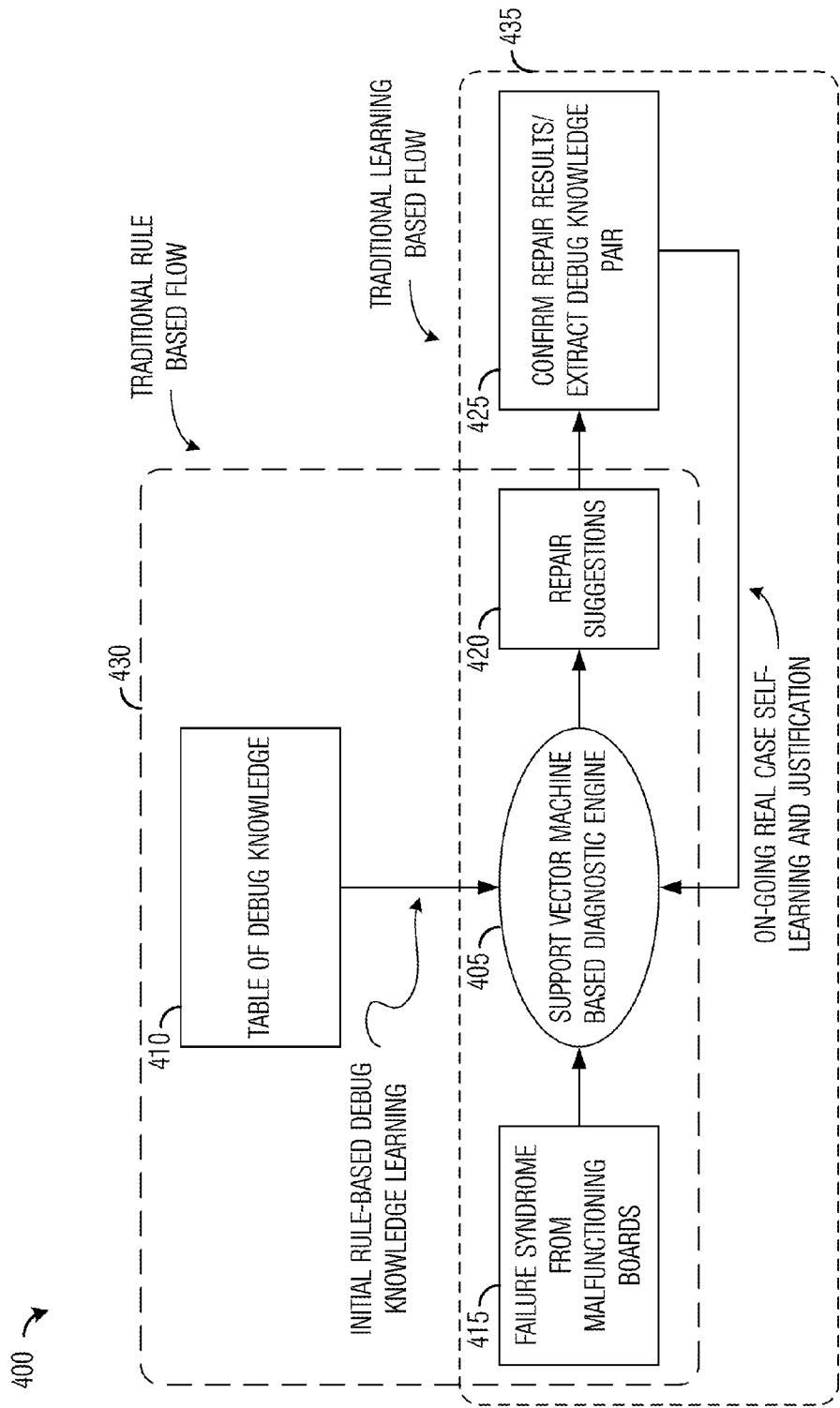
FIG. 4 illustrates an example detailed view of a hybrid diagnostic engine according to example embodiments described herein.

FIG. 4 illustrates a detailed view of a hybrid diagnostic engine 400. Hybrid diagnostic engine 400 includes a SVM-based diagnostic engine 405 that is configured with a table of debug knowledge (or table of debug knowledge pairs), with each debug knowledge pair being in the form of (test item, component). The table of debug knowledge comprises a plurality of debug knowledge pairs and is the set of input vectors discussed previously and may be defined by experienced test developer and optionally extracted from historic repair data for boards that are diagnosed by hybrid diagnostic engine 400. The table of debug knowledge may be used to specify (or determine) a kernel function, penalty parameters, an OSH, a margin, and the like, for hybrid diagnostic engine 400.

The debug knowledge as defined by a test developer, for example, and not directly derived from historical repair data may be referred to as predefined debug rules or rules. As an illustrative example, an experienced test developer through the development of tests may be able to specify potential component failures that are possible causes of failed tests. Table 1 illustrates an example table of rules as specified by a test developer. The debug knowledge may also be derived from historical repair data (also commonly referred to as historical board repair data). Table 2 illustrates an example of historical repair data.

TABLE 1

Table of Rules.

| Failed test | Possible faulty component(s) 1 | Possible faulty component(s) 2 | Possible faulty component(s) 3 |
|---|---|---|---|
| Test 1 | C1 | C2 | C3 |
| Test 2 | C5 | C7 | |
| Test 3 | C3 | C9 | |

TABLE 2

Historical Repair Data.

| Failed board serial number | Replaced component | Failed test(s) |
|---|---|---|
| 0001 | C1 | T1, T3, T100 |
| 0002 | C9 | T3, T5 |

Information about failure symptoms or failure syndromes 415 for faulty boards being diagnosed may be provided to SVM-based diagnostic engine 405. As an example, for each faulty board, information about the faulty board's symptom or syndrome may be provided to SVM-based diagnostic engine 405. SVM-based diagnostic engine 405 may provide a repair suggestion 420 for each faulty board. The repair suggestions may be provided to a technician(s) who may perform repairs on the faulty boards. The repaired boards may be re-run through a test system, such as test system 250, to determine if the repaired board has been fixed. Information about the repaired boards 425, including effectiveness of the repair suggestions, may be provided to SVM-based diagnostic engine 405 to enable SVM-based diagnostic engine 405 to update its configuration, such as OSH and margin, if needed. As an example, new debug knowledge (e.g., new debug knowledge pairs) may be extracted from the information about the repaired boards.

Portion 430 of hybrid diagnostic engine 400 may be considered to be traditional rule based operation where predefined debug rules and historical repair data are used to configure SVM-based diagnostic engine 405, while portion 435 of hybrid diagnostic engine 400 may be considered to be traditional learning based operation where feedback regarding repair suggestion effectiveness is used to update the configuration of SVM-based diagnostic engine 405.

Figure 5:
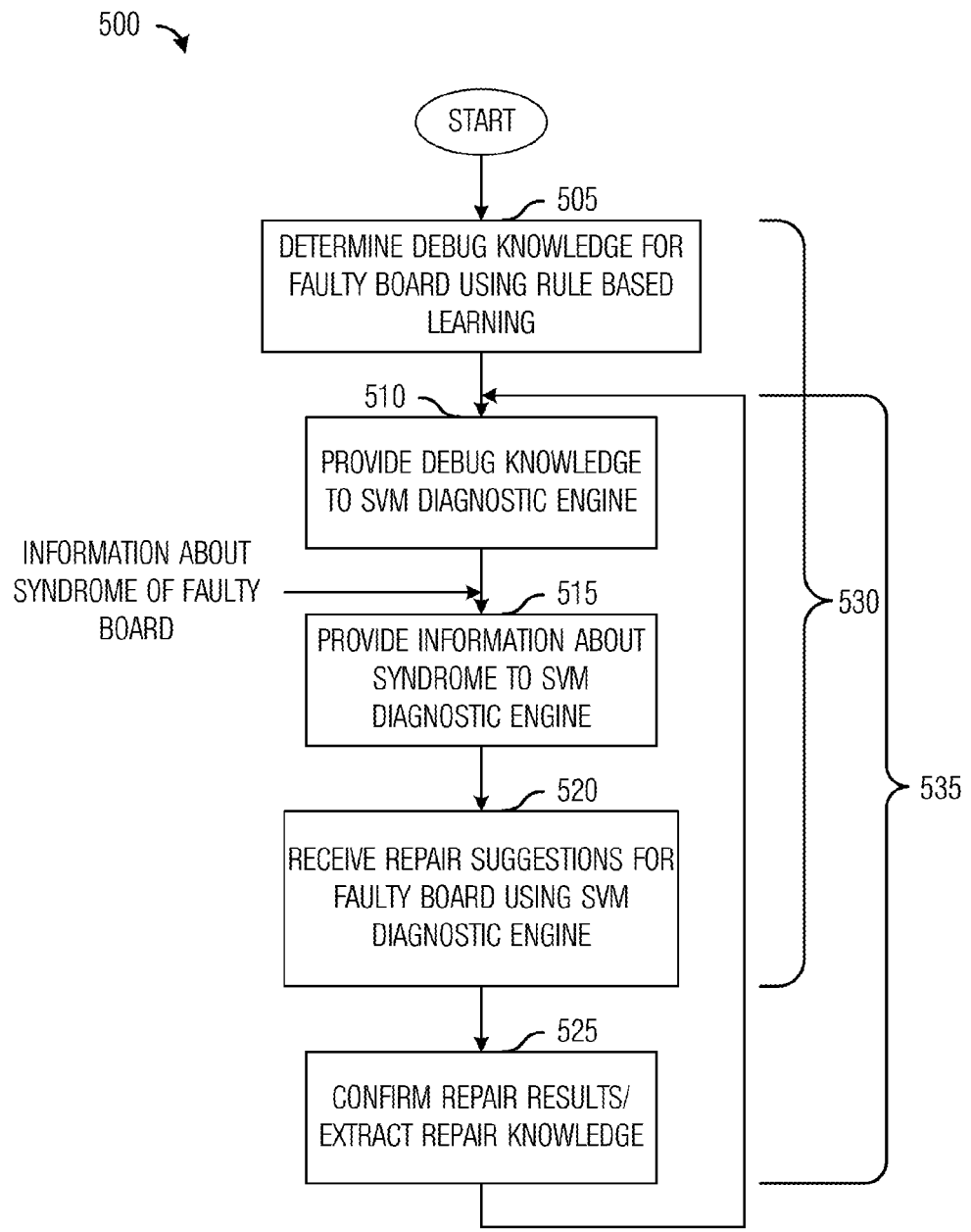
FIG. 5 illustrates an example flow diagram of operations occurring in a controller as the controller participates in diagnosing faulty boards according to example embodiments described herein.

FIG. 5 illustrates a flow diagram of operations 500 occurring in a controller as the controller participates in diagnosing faulty boards. Operations 500 may be indicative of operations occurring in a controller, such as controller 275, as the controller participates in diagnosing faulty boards using a hybrid diagnostic engine.

Operations 500 may begin with the controller determining debug knowledge from predefined debug rules and optionally historical data for the faulty boards being diagnosed by the hybrid diagnostic engine (block 505). Since each type of board (or even each variation or revision of a board) being diagnosed may have different sets of faults, symptoms, and the like, different debug knowledge may need to be formulated for different types of boards. The debug knowledge may be in the form of debug knowledge pairs. The controller may configure the hybrid diagnostic engine using the debug knowledge (block 510). As an example, a kernel function, penalty parameters, and the like, may be specified for the hybrid diagnostic engine. Additionally, the repair suggestion knowledge may be used to determining an OSH, a margin, and the like.

The controller may receive information about a symptom or a syndrome for a particular faulty board and provide the information to the hybrid diagnostic engine (block 515). The controller may receive a suggested repair(s) for the faulty board from the hybrid diagnostic engine (block 520). The suggested repair(s) may include information about which part of the faulty board to replace or adjust. The suggested repair(s) may be provided to a technician who will repair the faulty board. The repaired board may be retested to determine if the board passes testing (block 525). The controller may extract new debug knowledge from the results of the repair of the faulty board and use it to reconfigure (update) the hybrid diagnostic engine.

Figure 6:
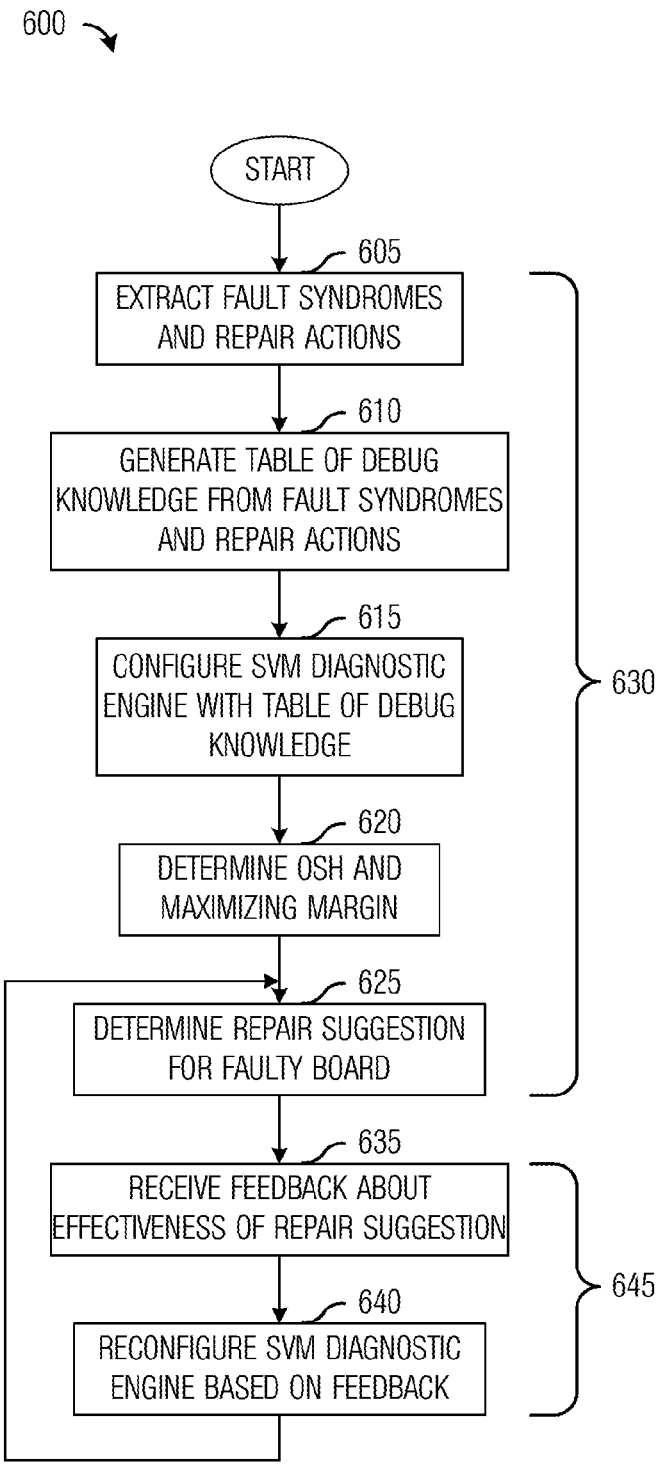
FIG. 6 illustrates an example flow diagram of operations occurring in a controller as the controller participates in diagnosing faulty boards utilizing a hybrid diagnostic engine according to example embodiments described herein.

FIG. 6 illustrates a flow diagram of operations 600 occurring in a controller as the controller participates in diagnosing faulty boards utilizing a hybrid diagnostic engine. Operations 600 may be indicative of operations occurring in a controller, such as controller 275, as the controller participates in diagnosing faulty boards using a hybrid diagnostic engine.

Operations 600 may begin with the controller extracting debug knowledge, e.g., fault symptoms (or fault syndromes) and repair actions, from predefined debug rules and optionally historical data (block 605). The debug knowledge may be in the form of an ordered pair, such as (fault symptom, repair action). The predefined debug knowledge may be provided by test developers who developed the test for the faulty boards. The historical data may be specific for the faulty boards being diagnosed. The historical data may be collected from a manufacturing facility that includes the controller and the hybrid diagnostic engine, i.e., they are co-located. The historical data may also be collected at other manufacturing facilities that are also manufacturing the same boards. The use of historical data from other manufacturing facilities enables a larger collection of historical data and may help improve diagnostic performance. The historical data may be stored in a database that is locally or remotely located.

The controller may generate a table of debug knowledge from the extracted debug knowledge (block 610). The table of debug knowledge may be an aggregation of the extracted debug knowledge. As an illustrative example, the table of debug knowledge may be a list of the ordered pairs, with duplicates removed. As another illustrative example, the table of debug knowledge may be a list of the ordered pairs with additional information, such as frequency of ordered pair appearance included as a potential indicator of frequency of a particular fault symptom. The table of debug knowledge may be used to configure the hybrid diagnostic engine (block 615). As an illustrative example, the controller may use the table of debug knowledge as the set of input vectors to configure the hybrid diagnostic engine. As an example, a kernel function, penalty parameters, and the like, may be specified for the hybrid diagnostic engine. The controller may determine the OSH, the margin, and the like, for the hybrid diagnostic engine (block 620). The determination of the OSH, the margin, and the like, for the hybrid diagnostic engine may proceed as discussed previously.

The controller may determine a repair suggestion for a faulty board using the hybrid diagnostic engine (block 625). The determination of the repair suggestion for the faulty board may be a multi-step process. As an example: information about a fault syndrome or a fault symptom of the faulty board (which may have previously been determined to be faulty) or an untested board (which has been determined to be faulty by a manufacturing test line) may be provided to the hybrid diagnostic engine; the hybrid diagnostic engine may select a repair suggestion for the faulty board in accordance with the fault syndrome or fault symptom and send the repair suggestion to the controller; the controller may provide the repair suggestion to a technician; the technician may repair the faulty board; and the technician may test the repaired board to determine if it has been fixed. Collectively, blocks 605-625 may be considered to be considered to be configuring and utilizing a rules-based diagnostic system.

The controller may receive feedback about the effectiveness of the repair suggestion (block 635). In other words, the controller may receive information about the effectiveness of the repair suggestion(s). The controller may use the feedback about the effectiveness of the repair suggestion to reconfigure the hybrid diagnostic engine (block 640). As an illustrative example, the controller may extract new debug knowledge from the feedback and update the table of debug knowledge, which may be used to reconfigure and/or update the hybrid diagnostic engine, as described in blocks 615 and 620, for example. Collectively, blocks 635 and 640 may be considered to utilizing a learning-based diagnostic system.

A variety of options may be used when it comes to reconfiguring the hybrid diagnostic engine. The controller may hold reconfiguring the hybrid diagnostic engine until it has received a first specified number of feedbacks. The controller may hold reconfiguring the hybrid diagnostic engine until it has received a second specified number of feedbacks indicating that the repair suggestion was ineffective. The second specified number of feedbacks may be smaller than the first specified number. The controller may hold reconfiguring the hybrid diagnostic engine until it receives a request or an instruction to do so. The controller may hold reconfiguring the hybrid diagnostic engine until a specified time event occurs. It is noted that the above discussion is intended for illustrative purposes only and to not limit the spirit or the scope of the example embodiments.

Figure 7:
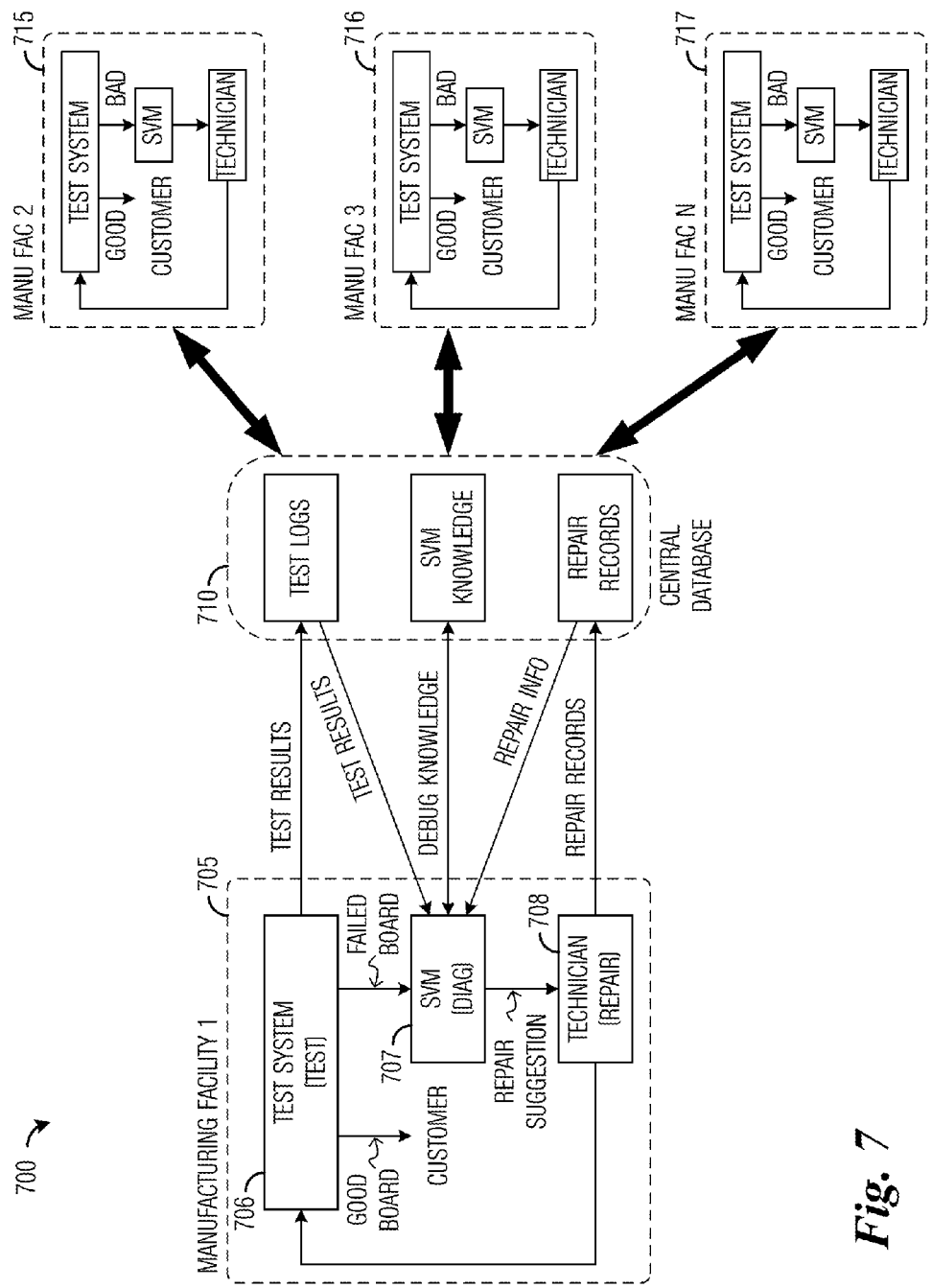
FIG. 7 illustrates an example distributed board testing system according to example embodiments described herein.

FIG. 7 illustrates a distributed board testing system 700. Distributed board testing system 700 includes individual board testing systems located at different manufacturing facilities. As an example, first manufacturing facility 705 may include a first board testing system, second manufacturing facility 715 may include a second board testing system, third manufacturing facility 716 may include a third board testing system, and fourth manufacturing facility 717 may include a fourth board testing system.

Each of the individual board testing systems may be identically configured or they may be configured differently depending upon considerations such as the boards that are being manufactured at the corresponding manufacturing facility, the technologies being used and supported, when the individual board testing systems were installed, and the like. A generic high level description of an individual board testing system may include a test system 706, a diagnostic system 707, and a technician infrastructure (repairs) 708.

A central database 710 may be used to store information, such as historical data, debug knowledge (e.g., debug knowledge pairs, tables of debug knowledge, and the like) related to board testing and/or board diagnosis, faulty board diagnostics, and the like. Centralized database 710 may be remotely located to the manufacturing facilities and may be connected to the manufacturing facilities by way of a communications network. Centralized database 710 may be located at one of the manufacturing facilities. Centralized database 710 may be a distributed database with portions of centralized database 710 located at different places. Centralized database 710 may be used to store test logs, which may include individual test information for the boards tested and/or diagnosed by the board testing systems, SVM knowledge, which may include configuration information (e.g., kernel functions, penalty parameters, OSHs, margins, and the like), repair records, which may include individual repair suggestions, repair results, and the like.

Figure 8:
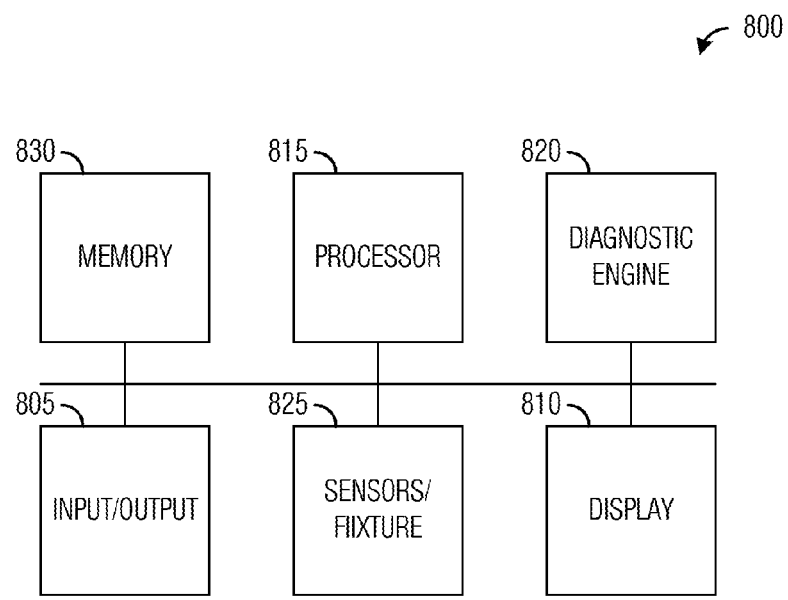
FIG. 8 illustrates an example first board testing system according to example embodiments described herein.

FIG. 8 illustrates a first board testing system 800. Board testing system 800 may be an implementation of board testing system utilizing a hybrid diagnostic engine to diagnose faulty boards. Board testing system 800 may be used to implement various ones of the embodiments discussed herein. As shown in FIG. 8, an input/output unit 805 is configured to facilitate input and/or output of data, commands, instructions, and the like. A display 810 is configured to provide visual information, such as to an operator of board testing system 800.

A processor 815 is configured to control the operation of board testing system 800. Processor 815 is configured to extract debug knowledge from predefined debug rules and optionally historical data, as well as generate a table of debug knowledge from the debug knowledge. Processor 815 is also configured to configure a diagnostic engine 820 using the table of debug knowledge. As an example, processor 815 configures diagnostic engine 820 by determining a kernel function, penalty parameters, an OSH, a margin, and the like. Processor 815 is configured to determine a repair suggestion for a faulty board. Diagnostic engine 820 is configured to use a SVM to implement a diagnostic engine. Sensors/fixtures 825 are configured to couple to a faulty board to retrieve faulty symptom and/or faulty syndrome. Input/output unit 805 is configured to output repair suggestions for faulty boards to technicians as well as receive feedback regarding the repair suggestions. A memory 830 is configured to store historical data, debug knowledge, table of debug knowledge, information regarding faulty symptoms and/or faulty syndrome, repair suggestions, feedback regarding repair suggestions, and the like.

The elements of board testing system 800 may be implemented as specific hardware logic blocks. In an alternative, the elements of board testing system 800 may be implemented as software executing in a processor, controller, application specific integrated circuit, or so on. In yet another alternative, the elements of board testing system 800 may be implemented as a combination of software and/or hardware. Diagnostic engine 820 may be implemented as a stand-alone unit coupled to processor 815.

Figure 9:
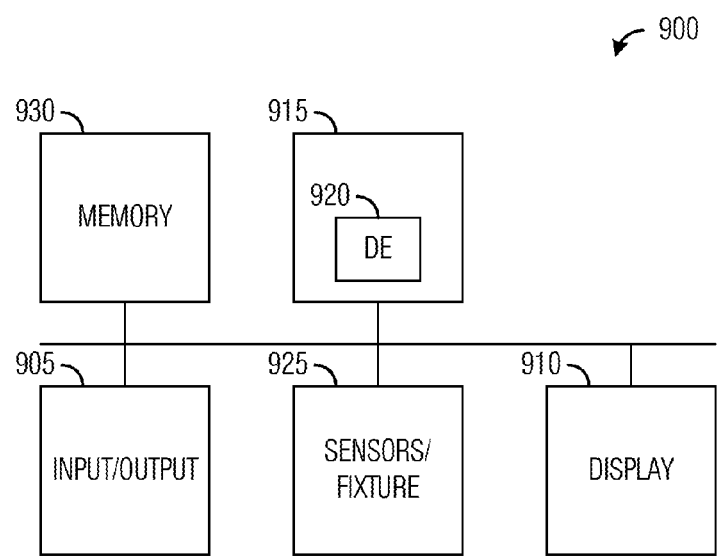
FIG. 9 illustrates an example second board testing system according to example embodiments described herein.

FIG. 9 illustrates a second board testing system 900. Board testing system 900 may be an implementation of board testing system utilizing a hybrid diagnostic engine to diagnose faulty boards. Board testing system 900 may be used to implement various ones of the embodiments discussed herein. As shown in FIG. 9, an input/output unit 905 is configured to facilitate input and/or output of data, commands, instructions, and the like. A display 910 is configured to provide visual information, such as to an operator of board testing system 900.

A processor 915 is configured to control the operation of board testing system 900. Processor 915 is configured to extract debug knowledge from predefined debug rules and optionally historical data, as well as generate a table of debug knowledge from the debug knowledge. Processor 915 is also configured to configure a diagnostic engine (DE) 920 using the table of debug knowledge. As an example, processor 915 configures diagnostic engine 920 by determining a kernel function, penalty parameters, an OSH, a margin, and the like. Processor 915 is configured to determine a repair suggestion for a faulty board. Diagnostic engine 920 is configured to use a SVM to implement a diagnostic engine. Sensors/fixture 925 are configured to couple to a faulty board to retrieve faulty symptom and/or faulty syndrome. Input/output unit 905 is configured to output repair suggestions for faulty boards to technicians as well as receive feedback regarding the repair suggestions. A memory 930 is configured to store historical data, debug knowledge, table of debug knowledge, information regarding faulty symptoms and/or faulty syndrome, repair suggestions, feedback regarding repair suggestions, and the like.

The elements of board testing system 900 may be implemented as specific hardware logic blocks. In an alternative, the elements of board testing system 900 may be implemented as software executing in a processor, controller, application specific integrated circuit, or so on. In yet another alternative, the elements of board testing system 900 may be implemented as a combination of software and/or hardware. Diagnostic engine 920 may be implemented as a unit in processor 915.

Figure 10:
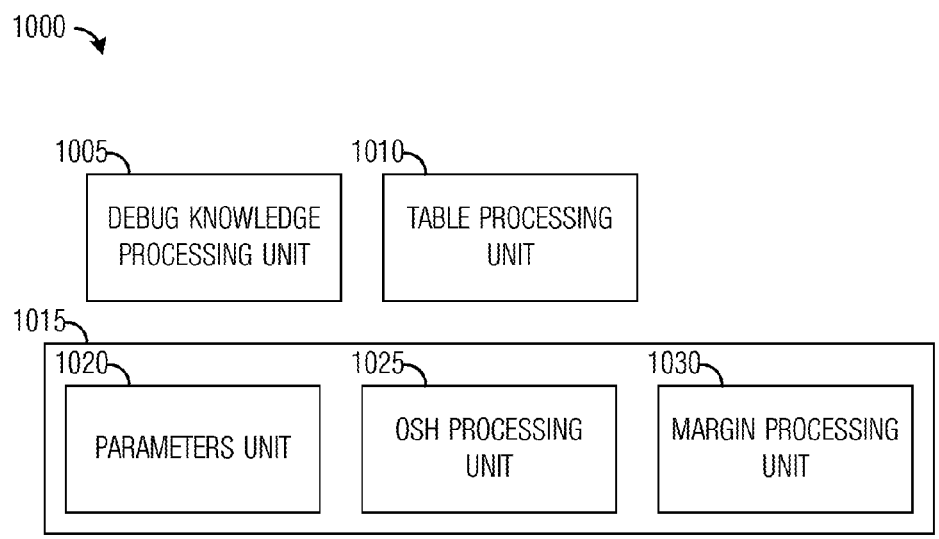
FIG. 10 illustrates an example detailed view of a first processor according to example embodiments described herein.

FIG. 10 illustrates a detailed view of a first processor 1000. Processor 1000 includes a plurality of units and/or modules that may be used to control the operation of a board diagnostic system. The units and/or modules may execute in processor 1000 and may be stored in a memory coupled to processor 1000.

A debug knowledge processing unit 1005 that is configured to extract debug knowledge pairs from predefined rules and optionally historical data. A table processing unit 1010 is configured to generate a table of debug knowledge from the debug knowledge pairs. A diagnostic engine configuring unit 1015 is configured to setup a diagnostic engine (which may be coupled to processor 1000) in accordance with the table of debug knowledge. Diagnostic engine configuring unit 1015 is configured to also setup the diagnostic engine in accordance with feedback regarding repair suggestions. A parameters unit 1020 is configured to determine parameters, such as a kernel function, penalty parameters, and the like, for the diagnostic engine. An OSH processing unit 1025 is configured to determine an OSH for the diagnostic engine, and a margin processing unit 1030 is configured to determine and maximize a margin for the diagnostic engine.

Figure 11:
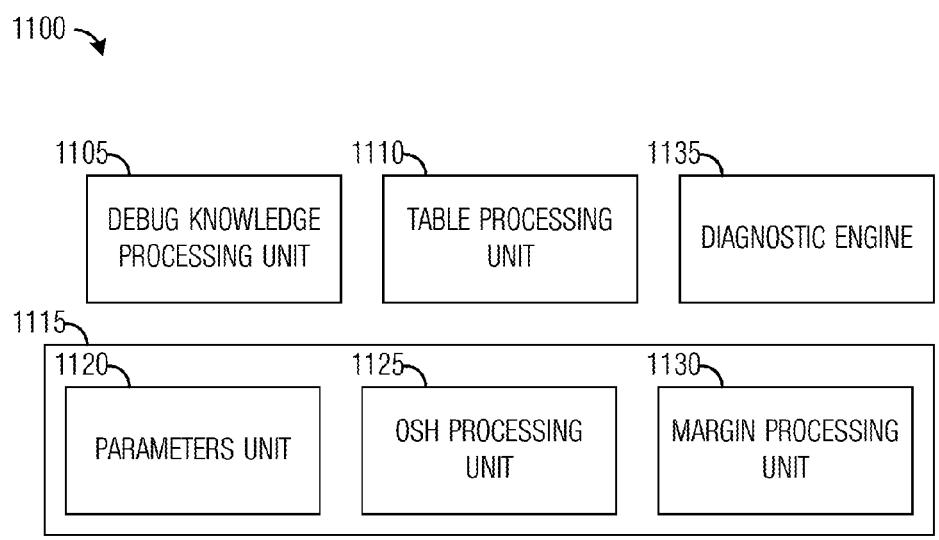
FIG. 11 illustrates an example detailed view of a second processor according to example embodiments described herein.

FIG. 11 illustrates a detailed view of a second processor 1100. Processor 1100 includes a plurality of units and/or modules that may be used to control the operation of a board diagnostic system. The units and/or modules may execute in processor 1100 and may be stored in a memory coupled to processor 1100.

A debug knowledge processing unit 1105 that is configured to extract debug knowledge pairs from predefined debug rules and optionally historical data. A table processing unit 1110 is configured to generate a table of debug knowledge from the debug knowledge pairs. A diagnostic engine configuring unit 1115 is configured to setup a diagnostic engine 1135 in accordance with the table of debug knowledge. Diagnostic engine configuring unit 1115 is configured to also setup the diagnostic engine in accordance with feedback regarding repair suggestions. A parameters unit 1120 is configured to determine parameters, such as a kernel function, penalty parameters, and the like, for diagnostic engine 1135. An OSH processing unit 1125 is configured to determine an OSH for diagnostic engine 1135, and a margin processing unit 1130 is configured to determine and maximize a margin for diagnostic engine 1135.

Although the present disclosure and its advantages have been described in detail, it should be understood that various changes, substitutions and alterations can be made herein without departing from the spirit and scope of the disclosure as defined by the appended claims.

What is claimed is:

1. A method for diagnosing a faulty board, the method comprising:
   generating, by a controller, a table of debug knowledge in accordance with predefined debug rules;
   configuring, by the controller, a hybrid diagnostic engine in accordance with the table of debug knowledge, wherein the hybrid diagnostic engine is a support vector machine based diagnostic engine;
   subjecting, by the controller, the faulty board to the hybrid diagnostic engine to generate a suggested repair;
   receiving, by the controller, feedback regarding an effectiveness of the suggested repair; and
   reconfiguring, by the controller, the hybrid diagnostic engine in accordance with the feedback regarding the effectiveness of the suggested repair.

2. The method of claim 1, further comprising generating the table of debug knowledge in accordance with historical board repair data.

3. The method of claim 1, wherein generating the table of debug knowledge comprises:
   extracting debug knowledge pairs from the predefined debug rules; and
   generating the table of debug knowledge from the debug knowledge pairs.

4. The method of claim 1, wherein the configuring the hybrid diagnostic engine comprises:
   determining parameters for the hybrid diagnostic engine in accordance with the table of debug knowledge; and
   determining an optimal separating hyperplane and a margin from the table of debug knowledge.

5. The method of claim 1, wherein subjecting the faulty board to the hybrid diagnostic engine comprises:
   retrieving information about a fault symptom of the faulty board;
   providing the information about the fault symptom to the hybrid diagnostic engine; and
   receiving the suggested repair from the hybrid diagnostic engine.

6. The method of claim 5, further comprising providing the suggested repair to a technician responsible for fixing the faulty board.

7. The method of claim 5, wherein retrieving the information about the fault symptom comprises retrieving the information about the fault symptom from test data associated with the faulty board.

8. The method of claim 1, wherein the feedback regarding the effectiveness of the suggested repair is received from a technician.

9. The method of claim 1, wherein reconfiguring the hybrid diagnostic engine comprises:
updating the table of debug knowledge in accordance with the feedback regarding the effectiveness of the suggested repair; and
reconfiguring the hybrid diagnostic engine in accordance with the table of debug knowledge as updated.

10. The method of claim 1, wherein the predefined debug rules are distinct from historical data.

11. A controller comprising:
a test fixture configured to hold a faulty board; and
a processor coupled to the test fixture, wherein the processor is configured to generate a table of debug knowledge in accordance with predefined debug rules, to setup a diagnostic engine in accordance with the table of debug knowledge, to subject the faulty board to the diagnostic engine to generate a suggested repair, to process feedback regarding an effectiveness of the suggested repair, and to adjust the diagnostic engine in accordance with the feedback regarding the effectiveness of the suggested repair, wherein the predefined debug rules are distinct from historical data.

12. The controller of claim 11, wherein the processor is configured to generate the table of debug knowledge in accordance with historical board repair data.

13. The controller of claim 11, wherein the processor is configured to extract debug knowledge pairs from the predefined debug rules, and to generate the table of debug knowledge from the debug knowledge pairs.

14. The controller of claim 11, wherein the processor is configured to determine parameters for the diagnostic engine in accordance with the table of debug knowledge, and to determine an optimal separating hyperplane and a margin from the table of debug knowledge.

15. The controller of claim 11, wherein the processor is configured to retrieve information about a fault symptom of the faulty board, to provide the information about the fault symptom to the diagnostic engine, and to receive the suggested repair from the diagnostic engine.

16. The controller of claim 15, wherein the processor is configured to provide the suggested repair to a technician responsible for fixing the faulty board.

17. The controller of claim 15, wherein the information about the fault symptom is retrieved from the faulty board attached to sensors operatively coupled to the controller.

18. The controller of claim 11, wherein the processor is configured to update the table of debug knowledge in accordance with the feedback regarding the effectiveness of the suggested repair, and to adjust the diagnostic engine in accordance with the table of debug knowledge as updated.

19. The controller of claim 11, wherein the diagnostic engine is a support vector machine based diagnostic engine.

20. A board diagnostic system comprising:
a hybrid diagnostic engine configured to diagnose a faulty board in accordance with a fault symptom of the faulty board, wherein the hybrid diagnostic engine is a support vector machine based diagnostic engine; and
a processor operatively coupled to the hybrid diagnostic engine, the processor configured to generate a table of debug knowledge in accordance with predefined debug rules, to setup the hybrid diagnostic engine in accordance with the table of debug knowledge, to subject the faulty board to the hybrid diagnostic engine to generate a suggested repair, to process feedback regarding an effectiveness of the suggested repair, and to adjust the hybrid diagnostic engine in accordance with the feedback regarding the effectiveness of the suggested repair.

21. The board diagnostic system of claim 20, wherein the processor is configured to extract debug knowledge pairs from the predefined debug rules, and to generate the table of debug knowledge from the debug knowledge pairs.

22. The board diagnostic system of claim 20, wherein the processor is configured to retrieve information about the fault symptom of the faulty board, to provide the information about the fault symptom of the faulty board to the hybrid diagnostic engine, and to receive the suggested repair from the hybrid diagnostic engine.

23. The board diagnostic system of claim 20, wherein the processor is configured to update the table of debug knowledge in accordance with the feedback regarding the effectiveness of the suggested repair, and to adjust the hybrid diagnostic engine in accordance with the table of debug knowledge as updated.

24. The board diagnostic system of claim 20, further comprising a test fixture operatively coupled to the processor and to the faulty board, the test fixture configured to hold the faulty board for diagnostic purposes.

* * * * *